United States Patent
Nelson et al.

(10) Patent No.: US 6,653,802 B1
(45) Date of Patent: Nov. 25, 2003

(54) STANDARD ELECTRONICS RACK-MOUNTED DIMMING CONTROL SYSTEM WITH PLUG-IN POWER MODULES AND COMMON PLUG-IN CONTROL MODULE

(75) Inventors: Terrence Leroy Nelson, Newberg, OR (US); Richard Alan Leinen, Wilsonville, OR (US)

(73) Assignee: Leviton Manufacturing Co., Inc., Little Neck, NY (US)

( * ) Notice: Subject to any disclaimer, the term of this patent is extended or adjusted under 35 U.S.C. 154(b) by 0 days.

(21) Appl. No.: 09/437,381

(22) Filed: Nov. 10, 1999

Related U.S. Application Data

(63) Continuation of application No. 09/015,089, filed on Jan. 29, 1998, now abandoned.
(60) Provisional application No. 60/107,993, filed on Nov. 10, 1998.

(51) Int. Cl.$^7$ ................................................. G05F 1/00
(52) U.S. Cl. ................. 315/291; 315/312; 315/DIG. 4; 361/614; 361/640; 361/725; 361/752; 361/826
(58) Field of Search ......................... 315/95, 199, 160, 315/291, 312, 313, 307, DIG. 4; 361/600, 614, 640, 683, 697, 715, 719, 720, 725, 736, 752, 796, 826

(56) References Cited

U.S. PATENT DOCUMENTS

| | | | | |
|---|---|---|---|---|
| 3,932,716 A | * | 1/1976 | Mottel et al. | 200/50.02 |
| 4,972,125 A | | 11/1990 | Cunningham et al. | 361/429 |
| 4,977,484 A | | 12/1990 | Cunningham et al. | 315/291 |
| 5,319,301 A | * | 6/1994 | Callahan et al. | 323/235 |
| 5,549,469 A | * | 8/1996 | Wild et al. | 431/75 |
| 5,640,061 A | * | 6/1997 | Bornhorst et al. | 307/150 |
| 5,680,294 A | * | 10/1997 | Stora et al. | 361/695 |
| 5,751,119 A | * | 5/1998 | LeVasseur | 315/291 |
| 5,770,928 A | * | 6/1998 | Chansky et al. | 315/362 |
| 5,789,908 A | * | 8/1998 | LeVasseur | 315/291 X |
| 6,002,563 A | * | 12/1999 | Esakoff et al. | 361/115 |
| 6,181,549 B1 | | 1/2001 | Mills et al. | 361/683 |
| 6,251,113 B1 | * | 6/2001 | Appelbaum et al. | 606/107 |

OTHER PUBLICATIONS

*EQUIPTO Electronics Corporation Corporate Profile and History* printed from *EQUIPTO Electronics Corporation* website located at http://www.equiptoelec.com/profile.htm on Jan. 3, 2001; pp. 1–2.
*EQUIPTO Enclosure Systems Technical Manual; Catalog Section 300–68*; updated Jan., 1976; pp. 1–4, 8 and 9.
*Electronic Industries Association, Engineering Department; Cabinets, Racks, Panels, and Associated Equipment, EIA–310–D*; Sep., 1992; pp. 1–18.
*ELECTROL Power Management Professional Dimming, Power/Load Distribution and DMX Interface brochure*; 1995; 16 pgs.

* cited by examiner

Primary Examiner—Haissa Philogene
(74) Attorney, Agent, or Firm—Marger Johnson & McCollom, P.C.

(57) ABSTRACT

A standard electronics rack-mounted dimming control system includes a chassis having spaces for power modules and a control module which can be inserted into and removed from the chassis without removing the chassis from the rack. Control electronics for generating drive signals for power control devices in the power modules are consolidated in the control module, thereby reducing the per-channel cost of the power modules an protecting the control electronics from heat generating power devices in the power modules. A power module includes an integral chassis and heatsink which forms the top, bottom and side walls of the module. The integral chassis and heatsink includes fins running the length of the module so that cooling air can flow through grooves between the fins when two modules are arranged side by side in the chassis. The integral chassis and heatsink also includes a groove having two shoulders running the length of the module which allows components to be mounted to the module using a captive nut in the groove.

22 Claims, 4 Drawing Sheets

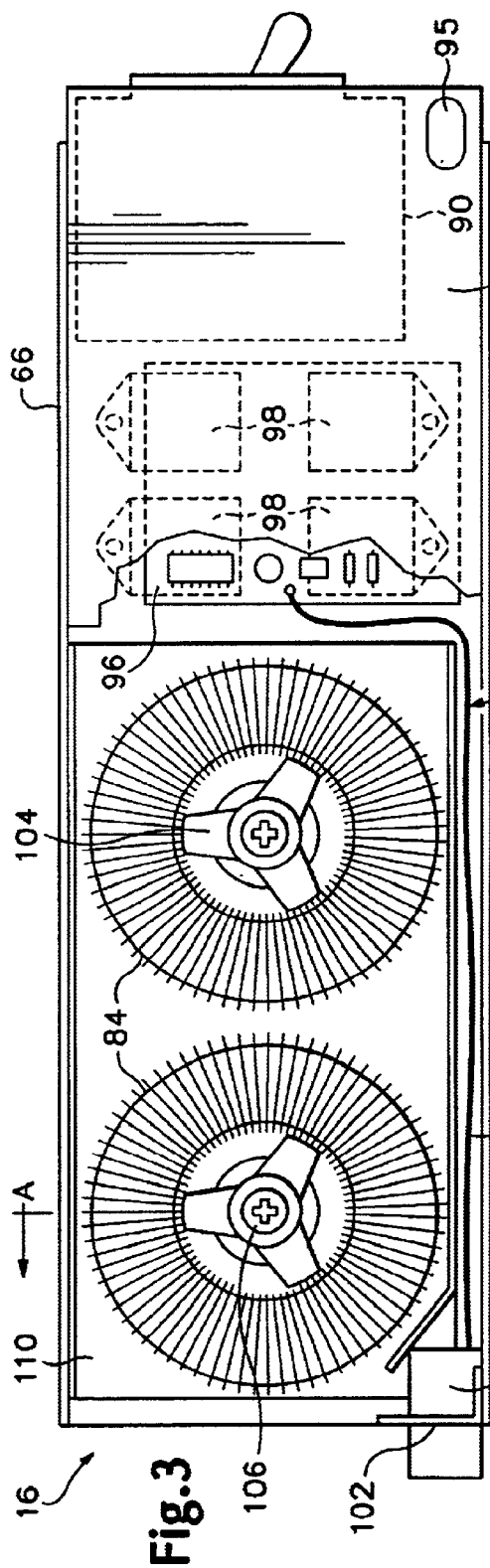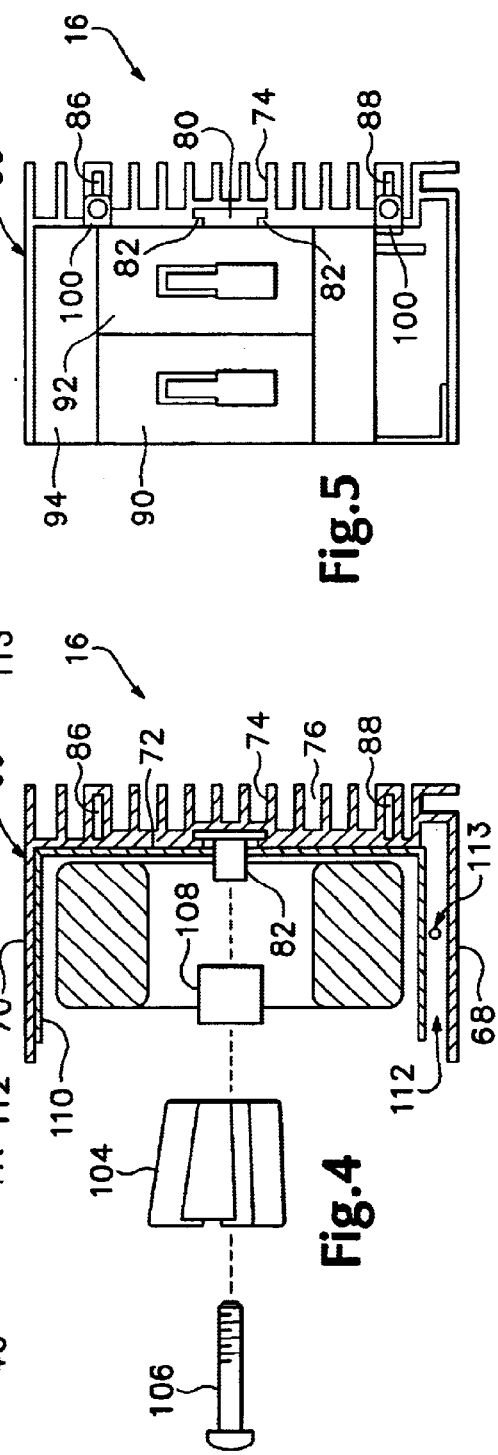

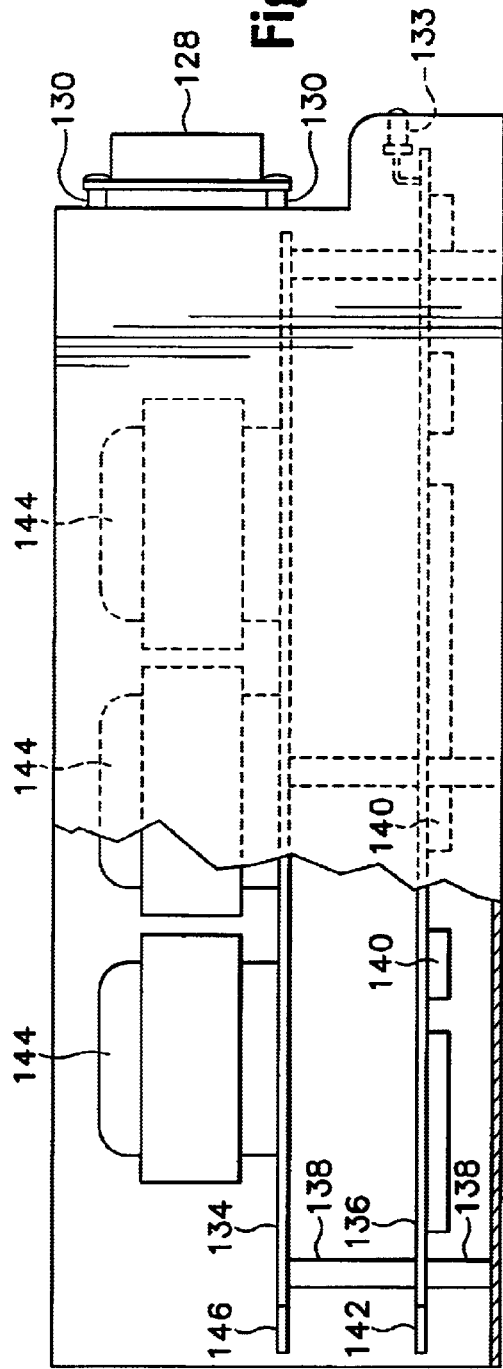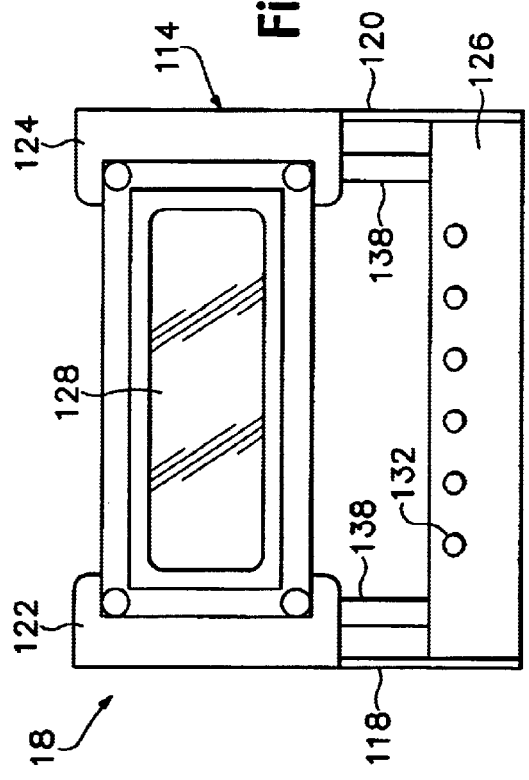

STANDARD ELECTRONICS RACK-MOUNTED DIMMING CONTROL SYSTEM WITH PLUG-IN POWER MODULES AND COMMON PLUG-IN CONTROL MODULE

This application claims priority from U.S. Provisional Application No. 60/107,993 filed Nov. 10, 1998 which is incorporated by reference, and which is a continuation of Ser. No. 08/015,089 filed Jan. 29, 1998 now abandoned.

BACKGROUND OF THE INVENTION

1. Field of the Invention

The present invention relates generally to dimming control systems, and more particularly to a standard electronics rack-mounted dimming control system with plug-in power modules and common plug-in control module.

2. Description of the Related Art

Lighting control systems for architectural, theatrical, and movie/television applications typically incorporate numerous individual dimmer circuits for controlling lights and other loads which are located throughout the building, stage, or studio. The dimmer circuits are usually rack mounted at one or more centralized locations to provide efficient distribution and control of electrical power. Specialized dimmer racks are commonly used to hold dimmer modules and their associated control circuitry. Each dimmer module can be plugged in the rack and typically provides power to two loads.

Dimmer circuits that mount in standardized electronics racks are also available. A common standard rack size has 19 inches wide slots that are measured in 1.75 inch high increments. Dimming systems for these standard racks are available in enclosures having screw-down top covers and ears on the front for mounting to standard electronics rack frames.

A problem with many of this type of enclosure is that the internal components are difficult to access for service when it is installed in a rack, especially when other equipment is mounted above the enclosure in the same rack. The entire enclosure must be unwired and removed from the rack to access the dimmer circuit components through the top cover.

Some have tried to solve this problem by locating some of the components most prone to failure near the front where they can be accessed through the front by unplugging the cables that connect the components and detaching them from their mounting hardware. This is still a difficult system to service and has not proven to be a very satisfactory solution to the problem.

SUMMARY OF THE INVENTION

One aspect of the present invention is an dimming system having an enclosure that mounts in a standard electronics rack and accepts plug-in power modules.

Another aspect of the present invention is a dimming module having an integral heat-sink and chassis.

BRIEF DESCRIPTION OF THE DRAWINGS

FIG. 3 is a side view of a power module in accordance with the present invention.

FIG. 4 is a cross sectional view of the power module of FIG. 3 taken through line A—A.

FIG. 5 is a front view of the power module of FIG. 3.

FIG. 6 is a side view of a control module in accordance with the present invention showing some components in a cutaway view.

FIG. 7 is a front view of the control module of FIG. 6.

DETAILED DESCRIPTION

Figure 1:
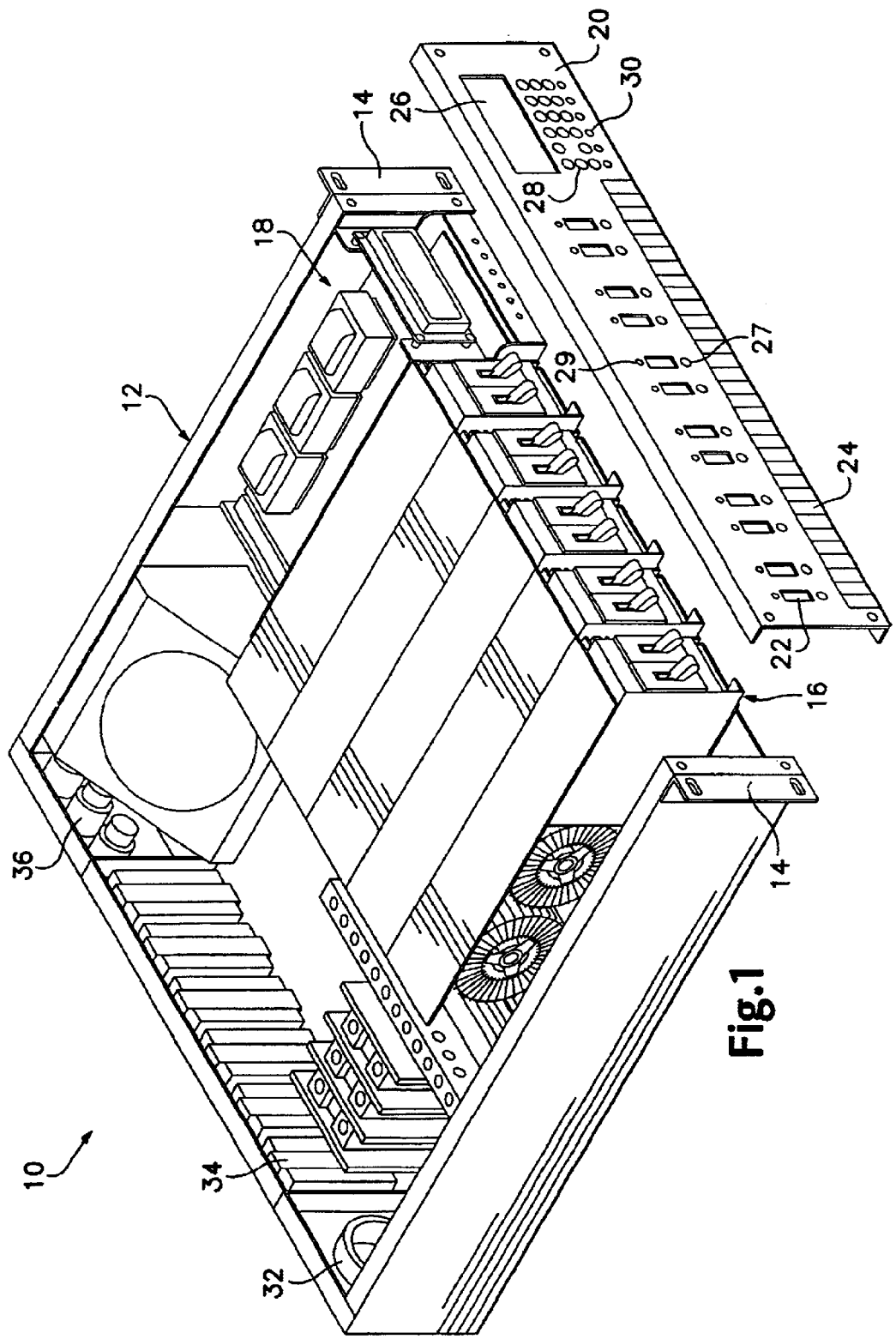
FIG. 1 is a perspective view of an embodiment of a dimming control system for a standard electronics rack in accordance with the present invention.

An embodiment of a dimming control system constructed in accordance with the present invention is shown generally at 10 in FIG. 1. The key components in FIG. 1 will be identified followed by a brief description of the operation of the system. A more detailed description of each of the components will then be provided along with a more detailed description of the operation of the system.

The system of FIG. 1 includes a chassis 12 sized to fit in a double-high (3.5 inch) slot in a standard electronics rack. The chassis includes ears 14 for securing the chassis in the rack. The front of the chassis is open to allow power modules 16 to slide into the chassis without removing the chassis from the rack. Each power module includes the main power components for two dimming circuits. Control module 18 slides into a dedicated space at one end of the rack.

A removable front panel 20 can be installed to cover the front of the chassis. The panel includes openings 22 to provide access to actuator levers on circuit breakers mounted on the front of the power modules, openings 24 to allow cooling air to flow through the front panel and past the power modules, opening 26 to allow viewing of a display device on the control module, and openings 30 to allow status indicators on the front of the control module to be viewed through the front panel. The surface of the front panel is covered with a multilayer laminate having integral blister switches 27 and light emitting diodes (LEDs) 29. A switch and LED is associated with each circuit breaker. Activating the switch places the dimmer circuit associated with the circuit breaker in a full-output test mode and turns the LED on. Additional switches are arranged to form a keypad 28 for entering input data into the control module. The front panel is electrically connected to the control module through a ribbon cable (not shown).

The rear of the chassis includes a fitting 32 for securing an input cable for providing input power to the system, output connectors 34 for providing output power to lighting loads, and control connectors 36 for providing data communication and control signals between the system 10 and other equipment.

In a preferred embodiment, each power module 16 includes two toroidal chokes, two circuit breakers, and two pairs of power control devices such as thyristors for independently controlling power to two separate lighting loads. The control electronics that generate the drive signals (e.g., gate drive pulses for thyristors) for the power control devices are included in the control module 18 which generates the drive signals in response to commands input manually from keypad 28 or control signals or commands input through connectors 36 at the back of the chassis. The power module 16 only includes a minimal amount of electronics such as opto-isolators and snubbers required to drive the power control devices in response to drive signals from the control module 18. By consolidating the control electronics in the control module, the per-channel cost of manufacturing this system is reduced. It also keeps the sensitive control electronics away from the heat generating power components in the power modules.

Although a preferred embodiment of the power module includes two dimming circuits, a power module in accordance with the present invention can also be fabricated with a single, higher-capacity circuit, or more than two, lower-capacity circuits.

Figure 2:
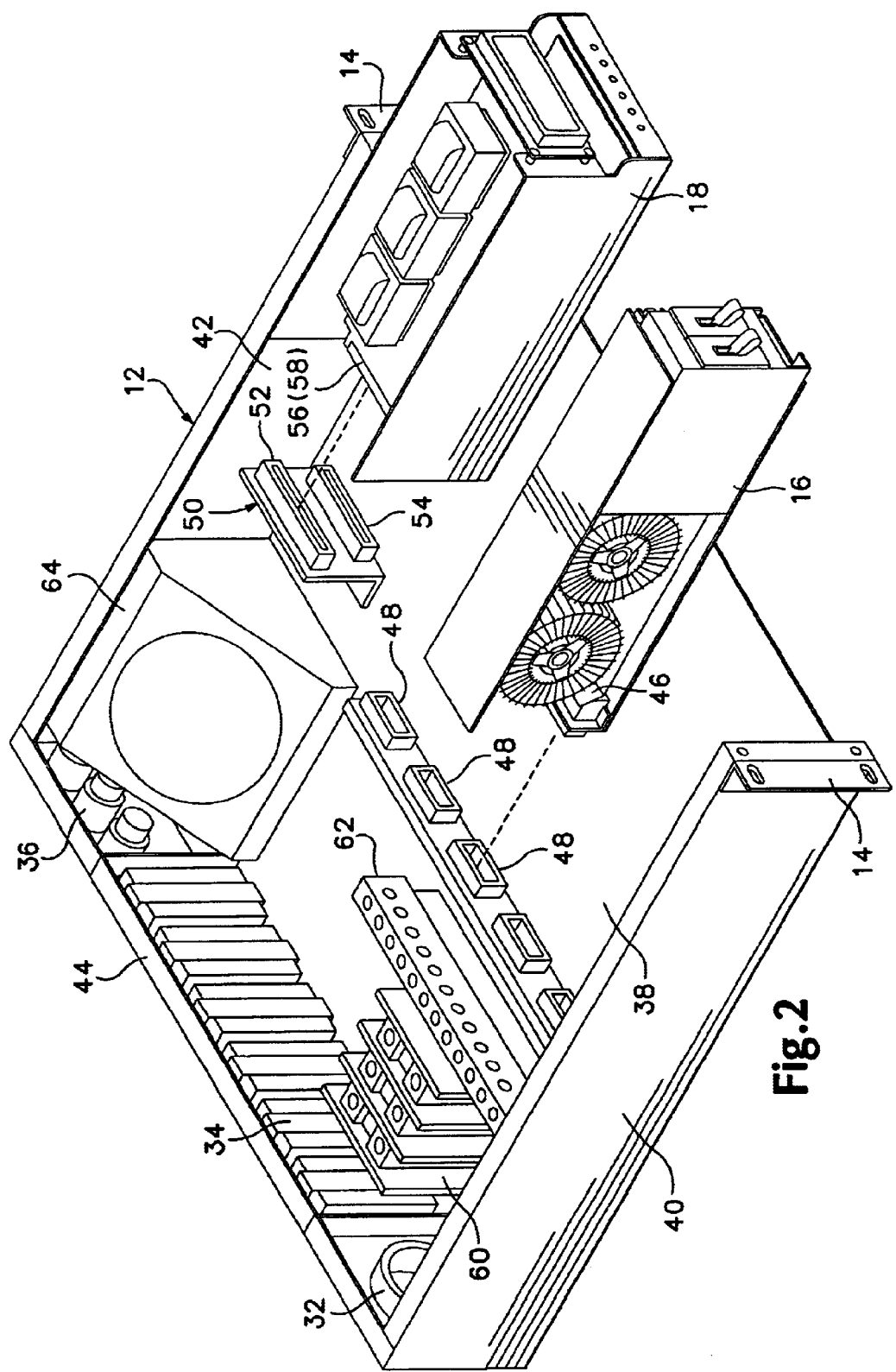
FIG. 2 is a perspective view showing more details of the chassis of the dimming system of FIG. 1 in accordance with the present invention.

A chassis for a standard rack mount dimming system in accordance with the present invention will now be described with reference to FIG. 2. The chassis includes an enclosure 12 formed from a single piece of sheet metal which is folded to form a bottom 38, a left sidewall 40, and a right sidewall 42. Rear panel 44 is formed from a separate piece of sheet metal screwed to the enclosure. The front half of the chassis is a plenum having spaces for receiving power modules 16 and control module 18 through the open front of the chassis. Each power module 16 includes a connector 46 located at the rear of the module for receiving input power, transmitting output power to a load, and receiving drive signals from the control unit. A row of connectors 48 is mounted to the bottom of the chassis so that connector 46 on each power module mates with a corresponding connector 48 when the power module is inserted into its space in the chassis.

At the far right hand side of the chassis, an upright member 50 supports card edge connectors 52 and 54 which mate with card edge contacts 56 and 58 (not shown) on printed circuit boards in the control module when the control module is inserted into its respective space in the chassis. Although the control module is shown at the right side of the chassis, a system in accordance with the present invention can alternatively have the control module on the left side, or anywhere in between.

A terminal block 60 mounted toward the rear of the chassis receives three-phase AC input power from conductors in an input cable secured to the chassis by fitting 32. The AC input power is distributed to the power module 16 through chassis wiring (not shown) which connect the terminal block 60 to the connectors 48. A neutral bus bar 62 is connected to the grounded conductor of the input power cable. Each of the output power connectors 34 is connected to the neutral bus bar 62 through chassis wiring (not shown). In the embodiment shown in FIG. 2 the output power connectors 34 are standard 115V duplex receptacles. However, any other suitable connectors can be used. Each of the output power connectors 34 is also connected to a corresponding one of the connectors 48 through chassis wiring (not shown) so that each of the two dimming circuits in corresponding power module 16 controls the output power to one of the two loads connected to the duplex receptacle.

The card edge connectors on upright member 50 are connected to terminal block 60 to provide input AC input power to power supplies in the control module. The card edge connectors are also connected to the row of connectors 48 to provide the drive signals to the dimming circuits in each power module 16. The card edge connectors on upright member 50 are also connected to control input connectors 36 through chassis wiring (not shown) to allow the control module to receive any suitable commands or control signals such as DMX, MPX, 0–10V DC analog inputs, or network connection such as the LUMA-NET® network from NSI Corporation, Tualatin, Oregon.

A cooling fan 64 is arranged near the rear of the chassis and draws air in through the front panel, through the power modules and control module, and out through the bottom and side of the chassis. The enclosure also includes a top cover (not shown) formed from a flat piece of sheet metal which completely covers the top of the enclosure and is secured to the left and right sidewalls and rear wall with screws.

A power module in accordance with the present invention will now be described in more detail with reference to FIGS. 3, 4 and 5. The power module includes an integral chassis and heatsink 66 formed from a single piece of extruded aluminum having a cross section as shown in FIG. 4. The aluminum extrusion includes a bottom portion 68 which forms a bottom wall of the module, a top portion 70 which forms a top wall of the module, and a side portion 72 which forms a right sidewall of the module. The bottom, top and side portions of the extrusion form an open channel in which the components of the dimmer circuits are arranged. Although the power module illustrated in FIGS. 3, 4 and 5 is shown with the left side of the channel open, a power module in accordance with the present invention can also be rotated so that the open side is on the top, the right side, or the bottom.

The right side of the extrusion includes fins 74 running the entire length of the module so that cooling air can flow through grooves 76 between the fins when the modules are arranged side by side in the chassis. The extrusion also includes a groove 78 running the entire length of the module at the bottom portion. The groove 78 engages ridges in the bottom of the chassis so as to guide the power module in a straight line as the module is inserted into the chassis. The ridges, which are not shown, can be formed economically in the bottom of the chassis by stamping and bending the sheet metal used to form the chassis.

Referring to FIG. 5, the extrusion used to form the integral chassis/heat sink 66 of each module includes a groove 80 having shoulders 82 running the entire length of the module. The groove 80 allows a T-nut 82 shown in FIG. 4 to be held captive for securing components such as toroidal chokes 84 to the chassis/heat sink as described below.

Referring to FIGS. 4 and 5, the extrusion forming the integral chassis/heat sink 66 also includes two additional slots 86 and 88 in the right sidewall, which run the entire length of the extrusion.

Referring to FIGS. 3 and 5, each power module includes two circuit breakers 90 and 92 mounted at the front of the module such that the circuit breaker paddles extend past the front of the module. Referring to FIG. 3, four thyristors 98 shown in phantom form are attached to the chassis/heat sink using screws that are threaded into holes that are tapped and drilled into grooves 86 and 88. Alternatively, thyristors 98 can be mounted to the chassis/heat sink using a captive nut such as T-nut 82 shown in FIG. 4.

The circuit breakers 90 and 92 are secured to, and held in the place by, a folded sheet metal housing 94 which covers the circuit breakers and PC board as shown in FIG. 3. The housing 94 is secured to the chassis/heat sink by screws through the top and bottom of the chassis/heat sink. Housing 94 also includes tabs 100 as best seen in FIG. 5 which can also be used to secure the housing to the chassis/heat sink with screws threaded into grooves 86 and 88.

The housing 94 also includes a slotted hole 95 at the front of the housing which provides a grip for pulling the power module out of the chassis.

A printed circuit board 96 is supported above the thyristors by soldering traces on the board to the thyristor leads. The PC board includes an opto-isolator and snubbing circuit for each of the two dimming circuits. Two of the thyristors provide phase control power regulation for each of the dimming circuits.

Referring again to FIG. 3, each power module also includes a connector 46 which is secured to the bottom of the chassis/heat sink with a folded metal bracket 102. Referring to FIGS. 3 and 4, two toroidal chokes 84 are secured to the chassis/heat sink by molded plastic retainers 104 which are secured by screws 106 that are threaded into T-nuts 82. A bushing 108 under each retainer 104 assures the proper positioning and tension of the retainers. A folded sheet of insulating material 110 isolates the chokes 84 from the chassis/heat sink and defines a raceway 112 for wiring that runs between the connector 46 and the circuit breakers, thyristors, and PC board.

An advantage of the power module design illustrated in FIGS. 3, 4, and 5, is that it provides a very simple and reliable module which is economical to manufacture. Another advantage is that it provides excellent cooling of the internal components due to the cooling air flow over the integral heat sink fins. Yet another advantage of the apparatus of FIGS. 3, 4, and 5 is that the open chassis provides easy access for servicing components.

Referring to FIG. 3, the internal wiring (not shown) for each of the two dimming circuits in each power module begins at connector 46 which is connected to one of the circuit breakers through an input conductor running through raceway 112. From the circuit breaker, current flows through another conductor to the thyristors through a connector on the PC board 96. Current flows out of the thyristor through another connector on the PC board, which is connected to one of the chokes 84 by a conductor running through raceway 112. Final output current from the inductor then flows to the connector 46 through another conductor in the raceway 112. The drive signals from the control module are coupled to the PC board through smaller gauge conductors 113 which are connected to connector 46 through raceway 112. The drive signals control the thyristors 98 through opto-isolators located on the PC board 96.

An embodiment of a control module in accordance with the present invention will now be described with reference to FIGS. 6 and 7. The control module includes an open chassis fabricated from sheet metal folded to form a bottom 116, a left sidewall 118, and a right sidewall 120. The left and right sidewalls have tabs 122 and 124, respectively, which are folded inward to form a surface for mounting display 128 on standoffs 130 so that it is visible from the front of the control module. The bottom of the chassis 116 has a tab 126 which is folded upward at the front of the control module and forms a front face having holes 132 through which status indicator lights 133 can be viewed.

Referring to FIG. 6, the control module includes a first printed circuit board 134 and a second printed circuit board 136 which are stacked on top of each other and mounted to the bottom of the chassis through spacers 138. The lower PC board 136 is connected to the input connectors 36 through PC board contacts 142 which engage card edge connector 54. The upper and lower PC boards are connected through a pin and socket header between the boards. The upper PC board 134 is interfaced to the rest of the system through PC board contacts 146 which engage card edge connector 52 in FIG. 2.

The lower PC board includes all of the control electronics required for generating the drive signals to the power modules. The lower PC board includes a microcontroller and associated support circuitry for performing all of the processing required to utilize the input signals and commands from connectors 36 on the back of the chassis. The microcontroller drives the display device 128 and receives input from the keypad 28 on the front panel through a ribbon connector attached to the PC board. Status indicators 133 are attached directly to the PC board. The microcontroller executes program code stored in ROM chips 140 which are mounted on sockets on the PC board and are accessible through openings in the bottom 116 of the control module chassis 114. Under control of the program code in ROMs 140, the microcontroller controls the overall operation of the dimming system and provides information on the status of the system through display device 128 and status indicators 133. The drive signals to the power modules 16 are generated on the lower PC board, pass through the upper PC board, and then out through the contacts 142 and card edge connector 52.

The upper PC board 134 includes transformers 144 and other circuitry for generating isolated power supplies for running the lower PC board 136 and for passing the drive signals through to the power modules 16. The upper PC board receives AC input power through connector 52 and contacts 146.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A dimming control system comprising a chassis adapted for mounting in a standard electronics rack, wherein the chassis includes a plurality of spaces structured to receive power modules having dimming circuits without having to remove the chassis from the rack.

2. A dimming control system according to claim 1 wherein the chassis further includes a plurality of first connectors arranged so that each first connector electrically couples one of the power modules to the chassis when it is inserted in the chassis.

3. A dimming control system according to claim 1 wherein the chassis further includes a space for receiving a control module without removing the chassis from the rack.

4. A dimming control system according to claim 3 wherein the chassis further includes conductors structured to couple drive signals from the control module to the power modules.

5. A dimming control system according to claim 3 wherein the chassis further includes:
   a plurality of first connectors arranged so that each first connector electrically couples one of the power modules to the chassis when it is inserted in the chassis; and
   a second connector arranged to electrically couple the control module to the chassis when it is inserted into the chassis.

6. A dimming control system according to claim 5 wherein the second connector includes a card edge connector.

7. A dimming control system according to claim 1 further including a front panel adapted to be removably attached to the chassis.

8. A dimming control system according to claim 7 wherein the front panel includes an opening to allow airflow through the front panel.

9. A dimming control system according to claim 7 wherein the front panel includes integral switches and/or indicators.

10. A power module for a dimming control system comprising:
    an integral chassis and heatsink;
    an electrical connector attached to the integral chassis and heatsink for coupling the power module to the dimming control system;

a circuit breaker attached to the integral chassis and heatsink; and a dimming circuit attached to the chassis for controlling current flowing through the circuit breaker.

11. A power module according to claim 10 wherein the electrical connector is arranged at a first end of the integral chassis and heatsink; and the circuit breaker is arranged at a second end of the integral chassis and heatsink opposite the first end.

12. A power module according to claim 10 wherein the integral chassis and heatsink includes a groove constructed to hold a nut captive.

13. A power module according to claim 10 wherein the dimming circuit includes a power control device and circuitry coupled to the electrical connector and power control device for driving the power control device responsive to drive signals received at the electrical connector.

14. A power module according to claim 10 further including:

a second circuit breaker arranged along side the first circuit breaker; and a second dimming circuit arranged in the chassis for controlling current flowing to a second load through the second circuit breaker.

15. A power module according to claim 10 wherein the integral chassis and heatsink includes a first portion which forms a first wall of the module, a second portion which forms a second wall of the module, and a third portion which forms a third wall of the module.

16. A power module according to claim 15 wherein the first wall is a bottom wall, the second wall is a top wall, and the third wall is a sidewall.

17. A power module according to claim 10 wherein the integral chassis and heatsink includes fins arranged along a wall of the module to facilitate airflow through grooves between the fins.

18. A power module according to claim 10 wherein the dimming circuit includes a choke and a power control device coupled in series between the circuit breaker and the electrical connector.

19. A power module according to claim 18 wherein:

the choke is mounted to the integral chassis and heatsink proximate the electrical connector; and the power control device is mounted to the integral chassis and heatsink between the choke and the circuit breaker.

20. A dimming control system comprising:

a chassis adapted for mounting in a standard electronics rack, wherein the chassis includes a plurality of spaces for receiving a plurality of power modules without removing the chassis from the rack;

a wherein each of the plurality of power modules supplies and controls power to loads, and wherein the power modules are adapted to be plugged into the chassis.

21. A dimming control system according to claim 20 further including a control module that is adapted to be plugged into the chassis.

22. A dimming control system according to claim 21 wherein:

the control module generates drive signals responsive to input commands or control signals; and the power modules control power to the loads responsive to the drive signals.

* * * * *

UNITED STATES PATENT AND TRADEMARK OFFICE
CERTIFICATE OF CORRECTION

PATENT NO.   : 6,653,802 B1
DATED        : November 25, 2003
INVENTOR(S)  : Terrence Leroy Nelson and Richard Alan Leinen It is certified that error appears in the above-identified patent and that said Letters Patent is hereby corrected as shown below:

<u>Title page,</u>
Item [63], Related U.S. Application, should read
-- [63] Continuation of application No. 09/015,089, filed on Jan. 29, 1998, now abandoned. --
[60] Provisional application No. 06/107,993, filed on Nov. 10, 1998. --

<u>Column 1,</u>
Line 8, should read -- incorporated by reference. --

<u>Column 8,</u>
Line 21, should read -- wherein each of the plurality of power modules supplies --

Signed and Sealed this

Thirtieth Day of March, 2004

JON W. DUDAS
*Acting Director of the United States Patent and Trademark Office*